(12) United States Patent
Wong et al.

(10) Patent No.: US 11,031,380 B2
(45) Date of Patent: Jun. 8, 2021

(54) MANUFACTURING METHOD OF MICRO LED DISPLAY MODULE

(71) Applicant: Syndiant Inc., Dallas, TX (US)

(72) Inventors: Chun Chiu Daniel Wong, Palo Alto, CA (US); Hiap Liew Ong, Southlake, TX (US); Min Hwang Michael Lyu, Taipei (TW); Liming Wang, TiangSu Province (CN)

(73) Assignees: SYNDIANT INC., Dallas, TX (US); XDMICRO (ZHONGSHAN) OPTOELECTRONIC SEMICONDUCTOR CO., LTD., Guangdong (CN)

( * ) Notice: Subject to any disclaimer, the term of this patent is extended or adjusted under 35 U.S.C. 154(b) by 82 days.

(21) Appl. No.: 15/997,844

(22) Filed: Jun. 5, 2018

(65) Prior Publication Data
US 2018/0358343 A1    Dec. 13, 2018

(30) Foreign Application Priority Data
Jun. 9, 2017    (TW) .................................. 106119263

(51) Int. Cl.
| H01L 25/00 | (2006.01) |
| H01L 25/18 | (2006.01) |
| H01L 27/15 | (2006.01) |
| H01L 33/00 | (2010.01) |
| H01L 25/16 | (2006.01) |

(Continued)

(52) U.S. Cl.
CPC ............ *H01L 25/18* (2013.01); *H01L 25/167* (2013.01); *H01L 25/50* (2013.01); *H01L 27/156* (2013.01); *H01L 33/0093* (2020.05); *H01L 33/0095* (2013.01); *H01L 33/12* (2013.01); *H01L 33/42* (2013.01); *H01L 33/504* (2013.01); *H01L 33/58* (2013.01); *H01L 33/62* (2013.01); *H01L 2224/48091* (2013.01);

(Continued)

(58) Field of Classification Search
CPC ..... H01L 25/18; H01L 25/50; H01L 25/0753; H01L 25/167; H01L 33/0079; H01L 33/005
See application file for complete search history.

(56) References Cited

U.S. PATENT DOCUMENTS 10,096,740 B1 * 10/2018 Chen ...................... H01L 33/005
10,325,894 B1 *  6/2019 Pan ....................... H01L 27/156

(Continued)

*Primary Examiner* — Michele Fan
(74) *Attorney, Agent, or Firm* — McClure, Qualey & Rodack, LLP

(57) ABSTRACT

A manufacturing method of micro LED display module is provided. The micro LED display module comprises a driver chip block, a LED block, a circuit board and a color layer. The driver chip block has a plurality of pixel electrodes. The LED block is disposed in the driver chip block and has two semiconductor layers and a plurality of trenches. One of the two semiconductor layers is electrically connected to the pixel electrodes and the other is electrically connected to the light transmissive conductive layer. The trenches define a plurality of micro LED pixels arranged in an array. Each trench at least penetrates through the light emitting layer and one of the semiconductor layers. Each micro LED pixel corresponds to one of the pixel electrodes. The circuit board is electrically connected to the driver chip block, and the color layer is disposed on the light transmissive conductive layer.

14 Claims, 17 Drawing Sheets

(51) Int. Cl.
   *H01L 33/62* (2010.01)
   *H01L 33/58* (2010.01)
   *H01L 33/42* (2010.01)
   *H01L 33/12* (2010.01)
   *H01L 33/50* (2010.01)

(52) U.S. Cl.
   CPC ............. *H01L 2933/0016* (2013.01); *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 2011/0297975 A1* | 12/2011 | Yeh | H04N 9/315 257/88 |
| 2016/0026315 A1* | 1/2016 | Choi | G06F 3/0414 345/174 |
| 2016/0218143 A1* | 7/2016 | Chaji | H01L 27/156 |
| 2016/0336486 A1* | 11/2016 | Lin | H01L 33/005 |
| 2017/0179097 A1* | 6/2017 | Zhang | H01L 25/50 |
| 2017/0345867 A1* | 11/2017 | Chaji | H01L 24/05 |
| 2018/0143729 A1* | 5/2018 | Lee | G06F 3/0416 |
| 2018/0182740 A1* | 6/2018 | Kim | H01L 25/0753 |
| 2018/0190615 A1* | 7/2018 | Pan | H01L 25/0655 |
| 2018/0247922 A1* | 8/2018 | Robin | H01L 25/167 |
| 2018/0261785 A1* | 9/2018 | Ahmed | H01L 51/508 |
| 2018/0308420 A1* | 10/2018 | Shin | G09G 3/32 |
| 2019/0019928 A1* | 1/2019 | Li | H01L 33/14 |
| 2019/0074324 A1* | 3/2019 | Kim | H01L 27/1248 |
| 2019/0123033 A1* | 4/2019 | Martin | H01L 25/0753 |
| 2019/0302917 A1* | 10/2019 | Pan | H01L 29/78678 |
| 2019/0385513 A1* | 12/2019 | Iguchi | H01L 33/62 |
| 2020/0251460 A1* | 8/2020 | Iguchi | H01L 33/62 |

* cited by examiner

MANUFACTURING METHOD OF MICRO LED DISPLAY MODULE

This application claims priority to Taiwan Patent Application No. 106119263 filed on Jun. 9, 2017, which issued as Taiwan Patent No. I611573B on Jan. 11, 2018.

CROSS-REFERENCES TO RELATED APPLICATIONS

Not applicable.

BACKGROUND OF THE INVENTION

Field of the Invention

The present invention relates to a light emitting diode (LED), and particularly, to a manufacturing method of micro LED display module.

Descriptions of the Related Art

Conventional light emitting diodes (LEDs) are mostly used as backlights of liquid crystal devices (LCDs) or directly as light emitting pixel points of the LEDs. However, when being used directly as light emitting pixel points of the LEDs, the conventional LEDs are mostly used for large-sized advertisement panels but seldom used in consumer electronic products due to the low resolution thereof.

As a kind of new display technology, micro LEDs have been developed in recent years. The micro LEDs are accomplished by miniaturizing and thinning LEDs into the micrometer scale and arraying them. In addition to having the advantages of the conventional inorganic LEDs such as high color saturation, high efficiency, high brightness and fast response and, when being used in a display device, being capable of displaying through self-emission without the need of a backlight, the micro LEDs also have the advantages of power saving, and simple in structure, thin and lightweight, and more importantly, the micro LEDs further have a super high resolution.

Besides, as compared with the organic LEDs, colors of the micro LEDs are easy to be accurately adjusted, and furthermore, the micro LEDs have advantages such as longer service life-time, higher brightness, less residual image, and better material stability.

Generally when micro LEDs described in Taiwan Patent No. 201640697A or the paper "Zhao Jun Liu et al., Monolithic LED Microdisplay on Active Matrix Substrate Using Flip-Chip Technology, IEEE Journal of Selected Topics In Quantum Electronics, pp. 1-5 (2009)" are used to manufacture a display module, micro LEDs of different colors must be manufactured in different batches respectively and are then attached in batches to a control circuit board, then a passivation layer and electrodes are formed through a physical deposition process, and the resulting structure is packaged to complete a micro LED display module.

However, because of the minimum volume of the micro LEDs, it is difficult to transfer (pick up and place) and wire bond the micro LEDs during the process of attaching the micro LEDs of different colors in batch, and this leads to low product yield, low production efficiency and high production cost.

SUMMARY OF THE INVENTION

The present invention provides a manufacturing method of micro LED display module, in which a plurality of micro LEDs is produced in an array form and disposed on a driver chip block so that each of the micro LED pixels is driven individually by pixel electrodes on the driver chip block; and a light transmissive conductive layer or structure (e.g., a semiconductor layer) inside the micro LEDs is used as a common electrode of the plurality of pixels. In this way, each of the micro LEDs can be addressed by the driver chip so as to emit light separately. Besides, the plurality of micro LEDs which are produced in an array form and can be transferred easily in the manufacturing process.

In addition, for the display of full-color images by the micro LED display module, a RGB (Red, Green, Blue) color layer may be further disposed, for example, a RGB color filter or quantum dots sprayed layer may be disposed. Therefore, a micro LED display module of high resolution can be produced; and the problem of low product yield that would otherwise be caused during the process of transferring the micro LEDs can be mitigated.

To achieve the aforesaid objectives, the present invention provides a manufacturing method of micro light emitting diode (LED) display module, the method comprising the following steps: preparing a LED wafer and a driver circuit wafer, wherein a portion of the LED wafer is defined as a LED block, the LED block has a first semiconductor layer, a light emitting layer and a second semiconductor layer, the light emitting layer is disposed between the first semiconductor layer and the second semiconductor layer, the first semiconductor layer connects with a substrate, one of the first semiconductor layer and the second semiconductor layer is a N-type semiconductor layer and the other is a P-type semiconductor layer, and a chip size portion of the driver circuit wafer is defined as a driver chip block; etching the LED block to form a plurality of trenches arranged crisscrossingly, wherein the trenches define a plurality of micro LED pixels arranged in an array, each of the trenches at least penetrates through the second semiconductor layer and the light emitting layer; bonding the LED block and the driver chip block to each other, wherein the second semiconductor layer is electrically connected to a plurality of pixel electrodes of the driver chip block, and each of the micro LED pixels corresponds to one of the pixel electrodes; and removing the substrate; disposing a light transmissive conductive layer on the first semiconductor layer, wherein the light transmissive conductive layer has a common electrode corresponding to the micro LED pixels; and disposing a color layer on the light transmissive conductive substrate, wherein the color layer is a RGB color layer.

To achieve the aforesaid objectives, the present invention provides a micro LED display module, which comprises: a driver chip block, having a plurality of pixel electrodes; a LED block, being disposed on the driver chip block and comprising two semiconductor layers and a plurality of trenches, wherein the light emitting layer is disposed between the two semiconductor layers, one of the two semiconductor layers is electrically connected to the pixel electrodes and the other is connected to a light transmissive conductive layer, the LED block is located between the light transmissive conductive layer and the driver chip block, the trenches define a plurality of micro LED pixels arranged in an array, each of the trenches at least penetrates through the light emitting layer and the semiconductor layer that is electrically connected to the pixel electrodes, each of the micro LED pixels corresponds to one of the pixel electrodes, one of the two semiconductor layers is a N-type semiconductor layer and the other is a P-type semiconductor layer; a circuit board electrically connected to the driver chip block, wherein the driver chip block is located between the LED block and the circuit board; and a color layer, being disposed on the light transmissive conductive layer, wherein the light transmissive conductive layer is located between the color layer and the LED block, and the color layer is a RGB color layer.

DESCRIPTION OF THE PREFERRED EMBODIMENT

Figure 1:
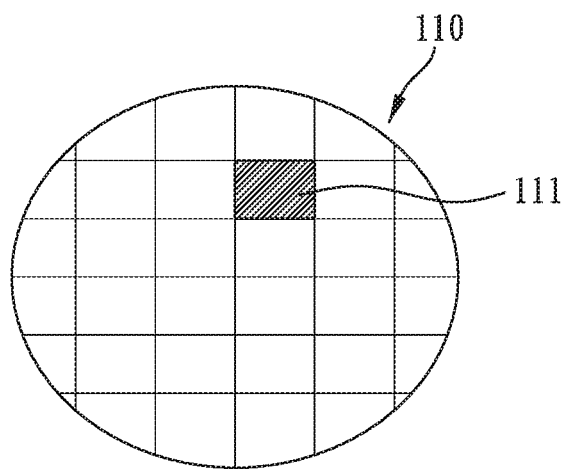
FIG. 1 is a schematic view of a LED wafer according to the present invention.
Figure 2:
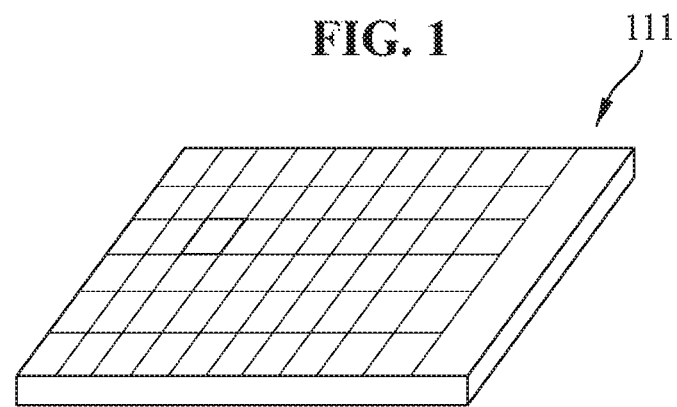
FIG. 2 is a schematic view of a LED block according to the present invention.
Figure 3:
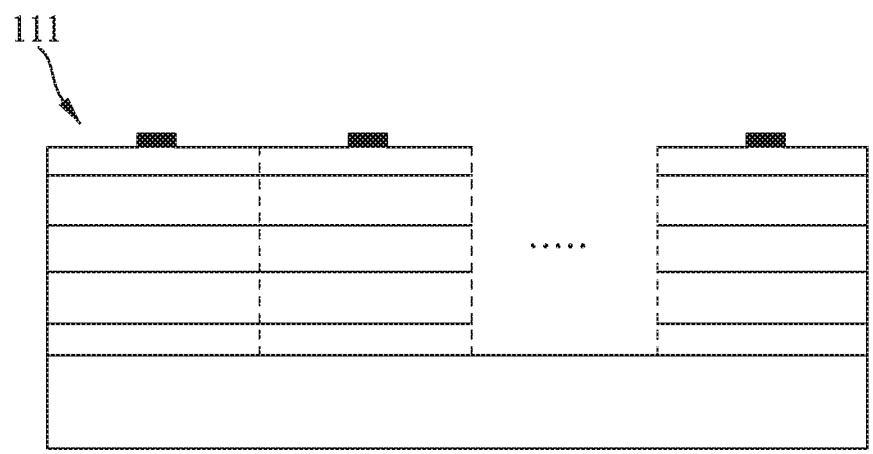
FIG. 3 is a schematic cross-sectional view of a LED block according to the present invention.
Figure 4:
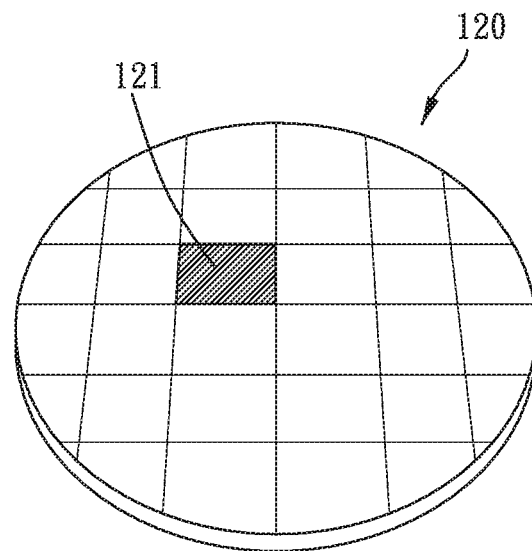
FIG. 4 is a schematic view of a driver circuit wafer according to the present invention.
Figure 5:
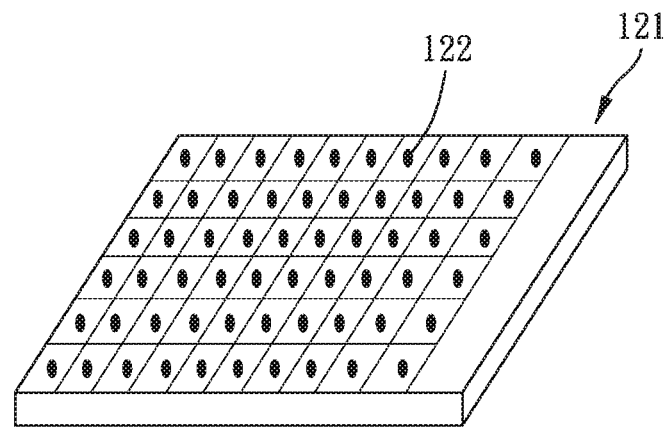
FIG. 5 is a schematic view of a driver chip block according to the present invention.

Hereinbelow, possible implementations of the present invention will be described with reference to embodiments thereof. However, it shall be firstly appreciated that, this is not intended to limit the scope of the present invention.

Please refer to FIG. 1 to FIG. 5, which show a LED wafer 110, a LED block 111, a driver circuit wafer 120 and a driver chip block 121 to be initially prepared in the manufacturing process of the present invention. For convenience of describing the embodiments of the present invention, unless otherwise stated in this specification, the LED block 111 may represent a portion of the LED wafer 110 which is still integrally connected with other portions of the LED wafer 110 or may be a portion that has already been diced from the LED wafer 110; and the driver chip block 121 may represent a portion of the driver circuit wafer 120 which is still integrally connected with other portions of the driver circuit wafer 120 or may be a driver chip that has already been diced from the driver circuit wafer 120. Each driver chip block 121 has a plurality of pixel electrodes 122 thereon, and each of the pixel electrodes 122 can independently drive a micro LED pixel.

That is, the time point at which the LED block 111 is diced from the LED wafer 110 and/or the driver chip block 121 is diced from the driver circuit wafer 120 may be any time point between the step of preparing the LED wafer and the driver circuit wafer and the step of electrically connecting the driver chip block with a circuit board.

In the present invention, when the LED wafer 110 and the driver circuit wafer 120 are prepared, some blank regions (e.g., regions where no semiconductor layer, light emitting layer, and pixel electrodes are provided) may be reserved for subsequently disposing electrode pads thereon or for performing dicing procedures thereon.

In addition, some lines shown in the drawings are only imaginary lines used in subsequent processes such as etching or dicing processes, and there may be no such lines in practice.

Please refer to FIG. 6C, FIG. 6D, FIG. 6E, FIG. 6G and FIG. 6H, which show a first embodiment of the present invention. The manufacturing method of a micro LED display module 600 of this embodiment comprises the following steps.

Initially, a LED wafer 610 and a driver circuit wafer 620 are prepared. A portion of the LED wafer 610 is defined as a LED block 611, and a chip size portion of the driver circuit wafer 620 is defined as a driver chip block 621. The LED block 611 has a first semiconductor layer, a light emitting layer 616 and a second semiconductor layer. The light emitting layer 616 is disposed between the first semiconductor layer and the second semiconductor layer. The first semiconductor layer connects with a substrate 612. More specifically, one of the first semiconductor layer and the second semiconductor layer is a N-type semiconductor layer and the other is a P-type semiconductor layer; and in this embodiment, the first semiconductor layer is a N-type semiconductor layer 613 and the second semiconductor layer is a P-type semiconductor layer 617. The N-type semiconductor layer 613 comprises a N-type doped layer 614 and a N-type buffer layer 615, and the N-type doped layer 614 is located between the N-type buffer layer 615 and the light emitting layer 616. The P-type semiconductor layer 617 further comprises a P-type doped layer 618 and a P-type buffer layer 619, and the P-type doped layer 618 is located between the P-type buffer layer 619 and the light emitting layer 616. In some embodiments of the present invention, there may not be the N-type or P-type buffer layer. Further speaking, the driver chip block 621 has a layer of integrated circuit (IC) and a plurality of pixel electrodes (on IC layer), wherein each of the pixel electrodes can be independently driven. The N-type doped layer 614 is a negative-pole semiconductor layer that is rich in electrons, and the P-type doped layer 618 is a positive-pole semiconductor layer that is rich in holes. The N-type buffer layer 615 is a transition layer between the N-type doped layer 614 and outside materials. The P-type buffer layer 619 is a transition layer between the P-type doped layers 618 and outside materials.

Figure 6A:
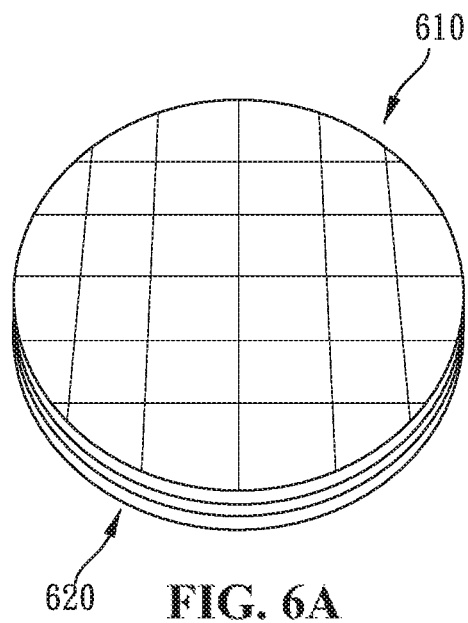
FIGS. 6A to 6I are schematic views of a first embodiment and other alternative embodiments according to the present invention.
Figure 6B:
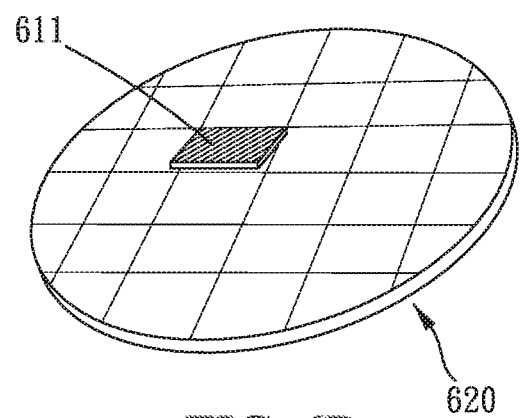
Figure 6C:
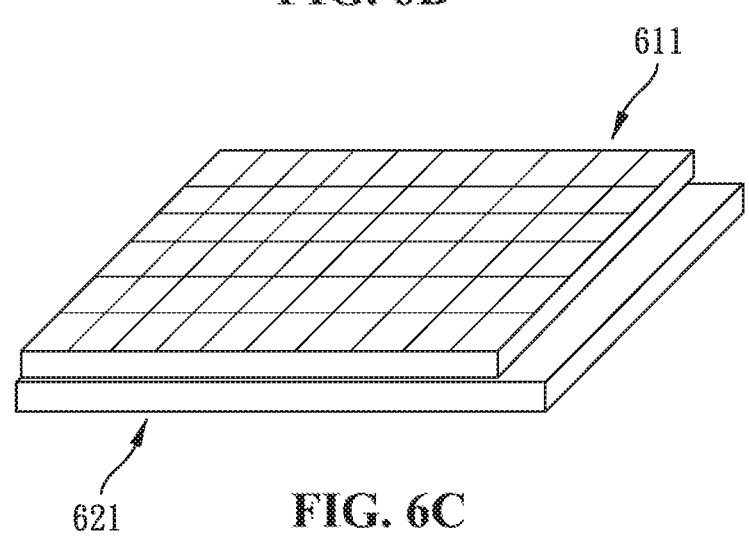
Figure 6D:
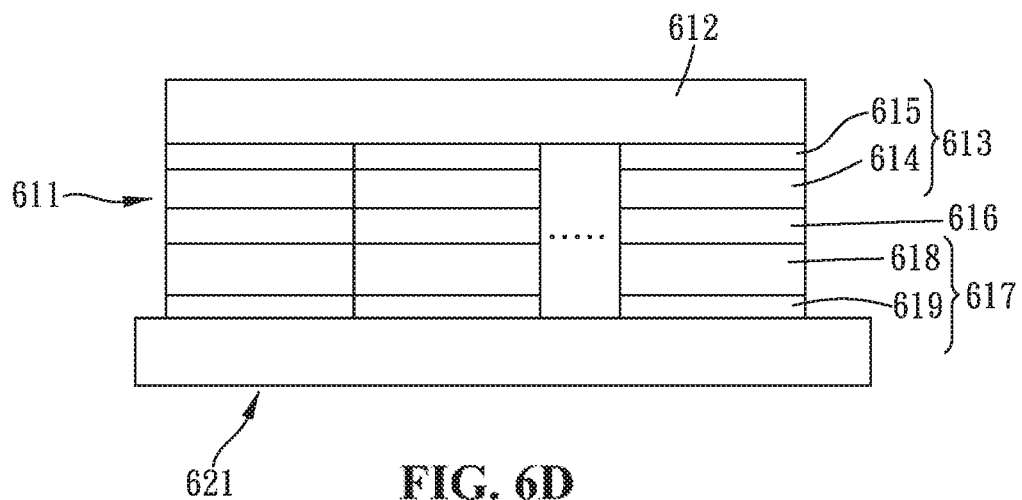

Referring next to FIG. 6C and FIG. 6D, the LED block 611 and the driver chip block 621 are bonded to each other so that the P-type semiconductor layer 617 is electrically connected to a plurality of pixel electrodes of the driver chip block 621. Preferably, to prevent influence on properties of the material, the LED block 611 and the driver chip block 621 are bonded by a low-temperature hybrid connection technology at a temperature lower than 200° C. to adhere the LED block 611 and the pixel electrodes of the driver chip block 621 together. It can be understood that, electrode pads may be additionally disposed to facilitate adhesion or electrical conduction. It shall be appreciated that, in this embodiment, the LED block 611 and the driver chip block 621 have already been diced from the LED wafer and the driver circuit wafer respectively before the bonding step is performed. Further in another embodiment as shown in FIG. 6A, the whole LED wafer 610 may be bonded to the driver circuit wafer 620; or as shown in FIG. 6B, the LED block 611 may be diced from the LED wafer in advance and then bonded to the driver circuit wafer 620.

Figure 6E:
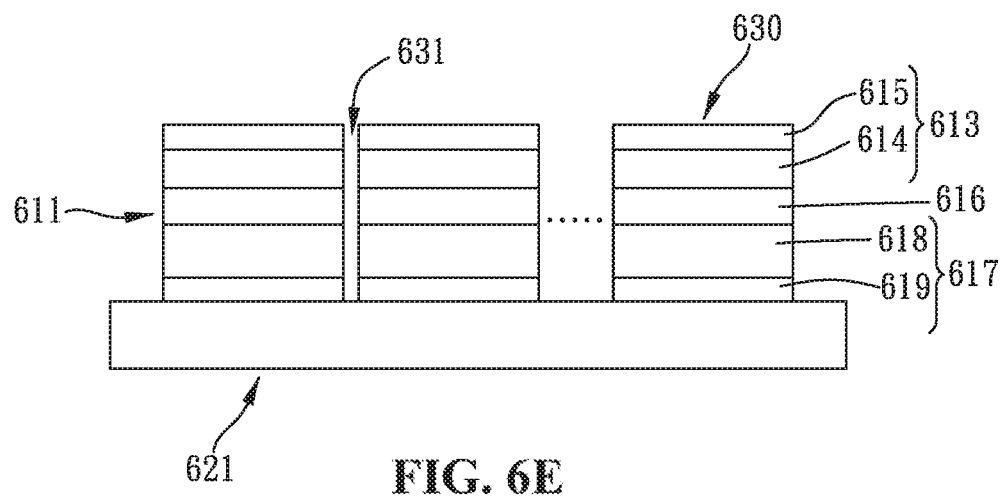

Referring next to FIG. 6E, the substrate 612 is removed and the LED block 611 is etched to form a plurality of trenches 631 arranged crisscrossingly. The trenches 631 define a plurality of micro LED pixels 630 arranged in an array (i.e., a micro LED array), and each of the micro LED pixels 630 corresponds to one of the pixel electrodes. In this way, each of the micro LED pixels 630 can be powered separately by a corresponding pixel electrode. It shall be appreciated that, the size of each of the micro LED pixels 630 is usually at the micrometer scale.

Figure 6F:
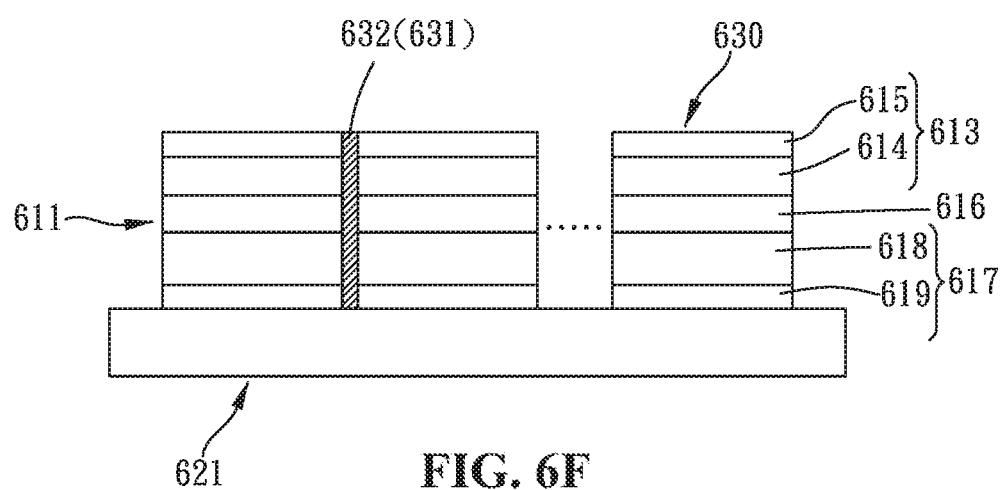

Referring next to FIG. 6F, non-conductive glue 632 is filled into the trenches 631 to improve the structural strength between the micro LED pixels 630. In other embodiments of the present invention, this step may be omitted.

Figure 6G:
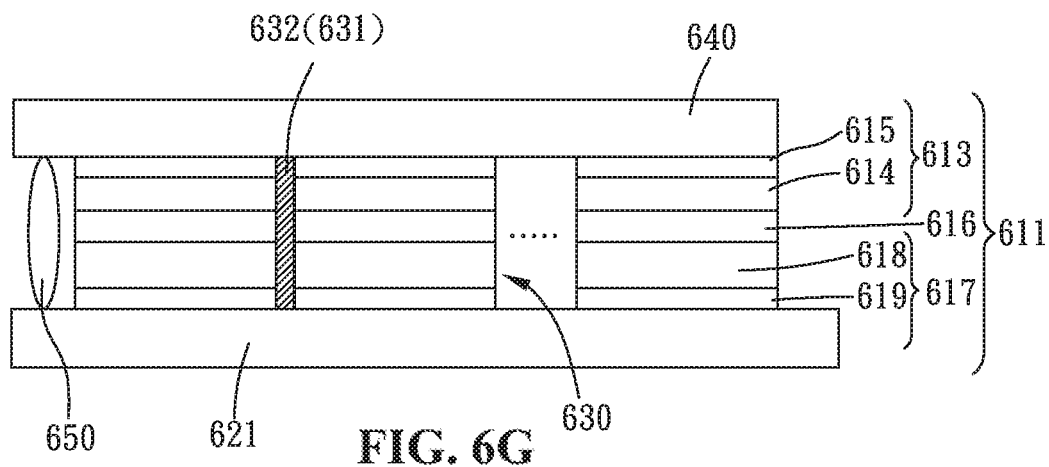

Referring next to FIG. 6G, a light transmissive conductive layer 640 is disposed on the N-type semiconductor layer 631. More specifically, the light transmissive conductive layer 640 comprises a glass layer coated with an ITO conductive film, and the ITO conductive film is electrically connected with each of the micro LED pixels 630, so that the ITO conductive film is the common electrode corresponding to the micro LED pixels 630. Moreover, the light transmissive conductive layer 640 is electrically connected to the driver chip block 621 via a conductive glue 650 (or other conductors). With a potential difference between the ITO conductive film and the pixel electrodes, each of the micro LED pixels 630 can be controlled to light up.

Figure 6H:
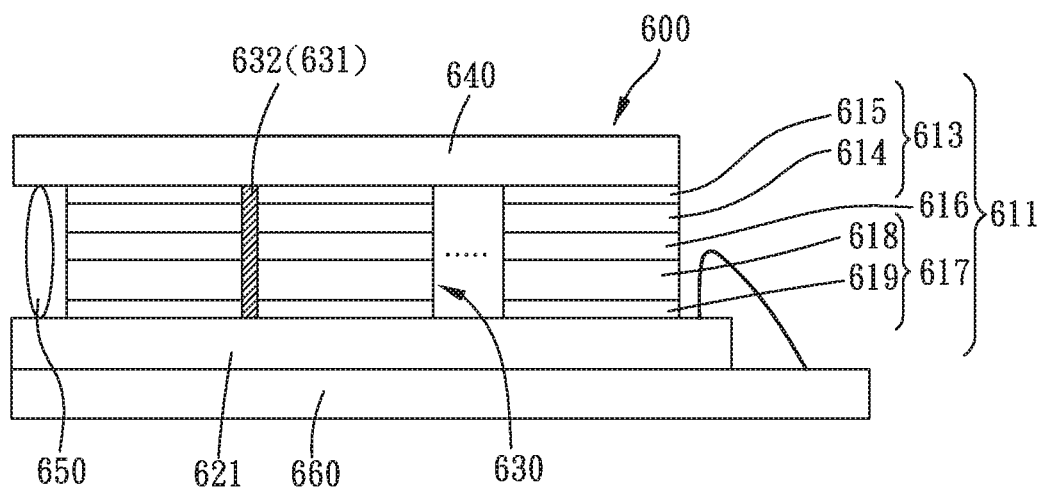
Figure 6I:
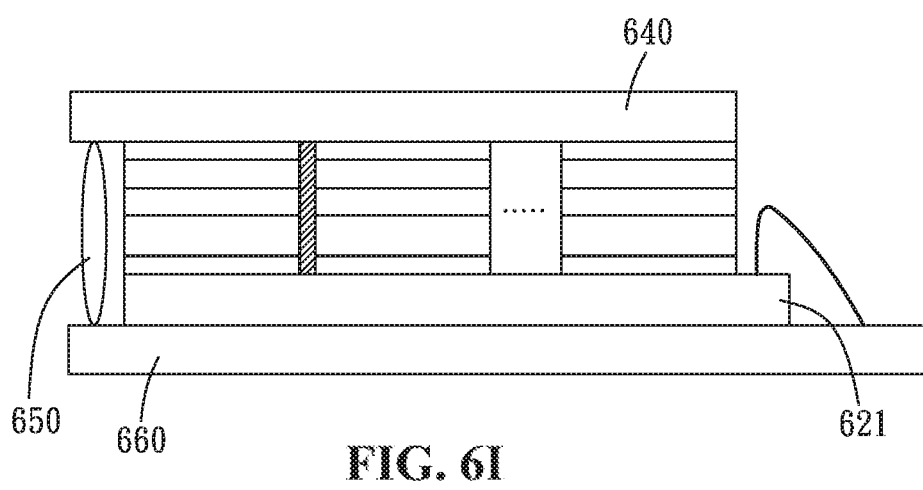

Referring next to FIG. 6H, the driver chip block 621 is electrically connected to a circuit board 660 (a printed circuit board (PCB) or a flexible circuit board). Further speaking, the driver chip block 621 is disposed on the circuit board 660 and is electrically connected to the circuit board 660 through wire bonding. It shall be appreciated that, when this step is performed, the driver chip block 621 and the LED block 611 have already been diced from the driver circuit wafer and the LED wafer respectively (i.e., have been in the form of an independent LED pixel array and an independent driver chip respectively). In another embodiment as shown in FIG. 6I, the conductive glue 650 may not connect the driver chip block 621, but connect the light transmissive conductive layer 640 and the circuit board 660. In some embodiments, the conductive glue may not be provided, and instead, the ITO conductive film is electrically connected to other external power sources as long as there is a potential difference between the ITO conductive film and the pixel electrodes to allow each micro LED pixel to light up.

Through the aforesaid steps, the micro LED display module 600 as shown in FIG. 6H can be produced. The micro LED display module comprises the driver chip block 621, the LED block 611, the light transmissive conductive layer 640, and the circuit board 660. The driver chip block 621 has a plurality of pixel electrodes. The LED block 611 is disposed on the driver chip block 621. The LED block 611 has the first semiconductor layer, the light emitting layer 616, the second semiconductor layer and a plurality of trenches 631. The light emitting layer 616 is located between the first semiconductor layer and the second semiconductor layer. The second semiconductor layer is electrically connected to the pixel electrodes. The trenches 631 define the plurality of micro LED pixels 630 arranged in an array form. Each of the trenches 631 penetrates through the first semiconductor layer, the second semiconductor layer and the light emitting layer 616. Each of the micro LED pixels 630 corresponds to one of the pixel electrodes. One of the first semiconductor layer and the second semiconductor layer is the N-type semiconductor layer 613 and the other is the p-type semiconductor layer 617. Each of the trenches 631 is filled with the non-conductive glue 632 therein.

The light transmissive conductive layer 640 is disposed on the LED block 611 and connected to the first semiconductor layer. The LED block 611 is located between the light transmissive conductive layer 640 and the driver chip block 621. The circuit board 660 is electrically connected to the driver chip block 621, and the driver chip block 621 is located between the LED block 611 and the circuit board 660. The conductive glue 650 is disposed between the light transmissive conductive layer 640 and the driver chip block 621 to electrically connect the light transmissive conductive layer 640 and the driver chip block 621. The light transmissive conductive layer 640 comprises the glass layer coated with the ITO conductive film, and the ITO conductive film is electrically connected to each of the micro LED pixels 630. In another embodiment as shown in FIG. 6I, the conductive glue 650 may also be disposed between the light transmissive conductive layer 640 and the driver chip block 621 to electrically connect the light transmissive conductive layer 640 and the driver chip block 621.

Please refer to FIG. 7A, FIG. 7B, FIG. 7E, FIG. 7F, FIG. 7G, FIG. 7H and FIG. 7I, which show a second embodiment of the present invention. A manufacturing method of a micro LED display module 700 according to this embodiment comprises the following steps.

Initially, a LED wafer 710 and a driver circuit wafer 720 are prepared. A portion of the LED wafer 710 is defined as a LED block 711, and a chip size portion of the driver circuit wafer 720 is defined as a driver chip block 721. The LED block 711 has a first semiconductor layer, a light emitting layer 716 and a second semiconductor layer. The light emitting layer 716 is disposed between the first semiconductor layer and the second semiconductor layer. The first semiconductor layer connects with a substrate 712. One of the first semiconductor layer and the second semiconductor layer is a N-type semiconductor layer and the other is a P-type semiconductor layer. More specifically, the first semiconductor layer is a N-type semiconductor layer 713 and the second semiconductor layer is a P-type semiconductor layer 717. The N-type semiconductor layer 713 comprises a N-type doped layer 714 and a N-type buffer layer 715, and the N-type doped layer 714 is located between the N-type buffer layer 715 and the light emitting layer 716. The P-type semiconductor layer 717 further comprises a P-type doped layer 718 and a P-type buffer layer 719, and the P-type doped layer 718 is located between the P-type buffer layer 719 and the light emitting layer 716. In some embodiments of the present invention, there may not be the N-type or P-type buffer layer.

Figure 7A:
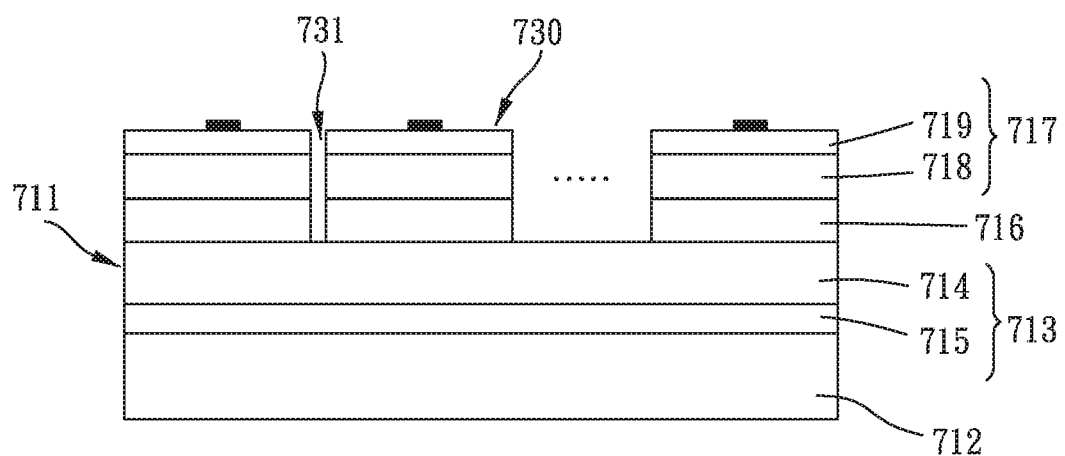
FIGS. 7A to 7L are schematic views of a second embodiment and other alternative embodiments according to the present invention.

Referring to FIG. 7A, the LED block 711 is etched to form a plurality of trenches 731 arranged crisscrossingly. The trenches 731 define a plurality of micro LED pixels 730 arranged in an array (i.e., a micro LED array), and each of the trenches 731 at least penetrates through the P-type semiconductor layer 717 and the light emitting layer 716. Further speaking, each of the trenches 731 does not penetrate through the N-type semiconductor layer 713, and the N-type semiconductor layer 713 is a common electrode corresponding to the micro LED pixels 730. In other embodiments of the present invention, each of the trenches may penetrate through the N-type semiconductor layer or penetrate through only the N-type doped layer as long as there is a common electrode for the light transmissive conductive layer. It can be understood that, the step of etching the LED block may etch the whole LED wafer, or etch only the LED block 711 that has been diced.

Figure 7B:
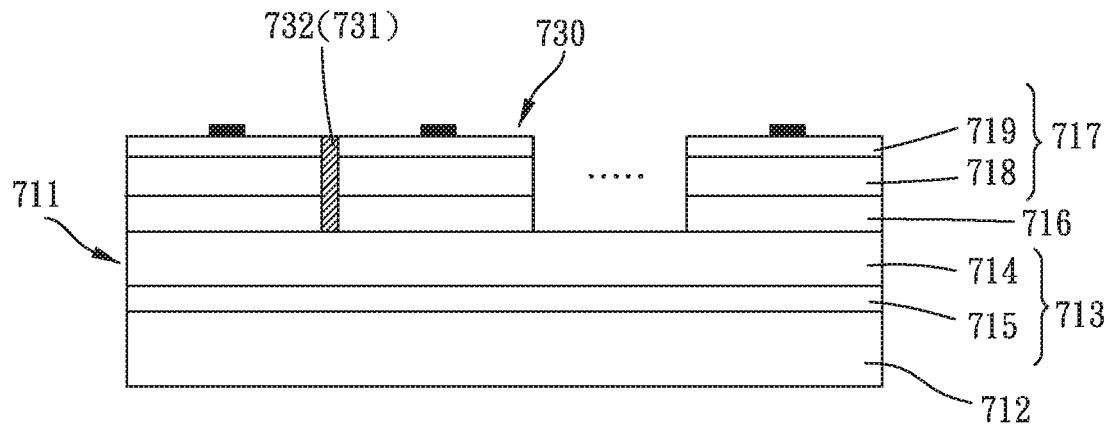

Referring next to FIG. 7B, non-conductive glue 732 is filled into the trenches 731 to improve the structural strength between the micro LED pixels 730. In other embodiments of the present invention, this step may be omitted.

Figure 7C:
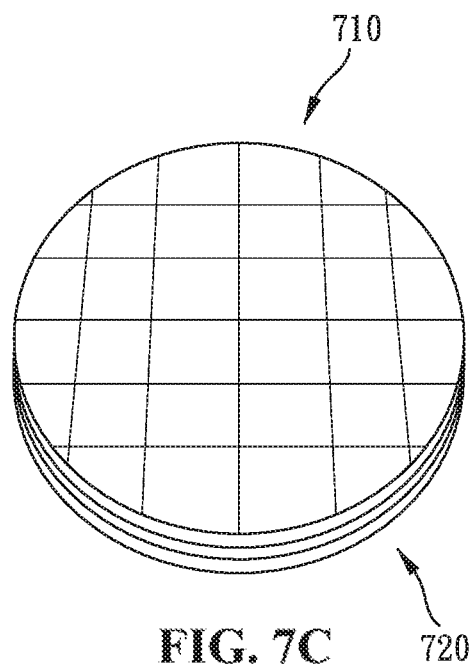
Figure 7D:
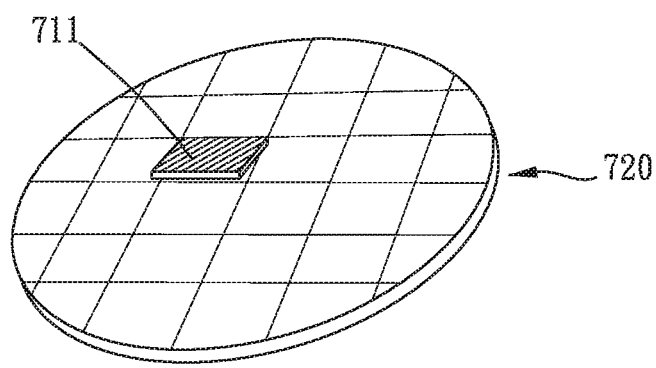
Figure 7E:
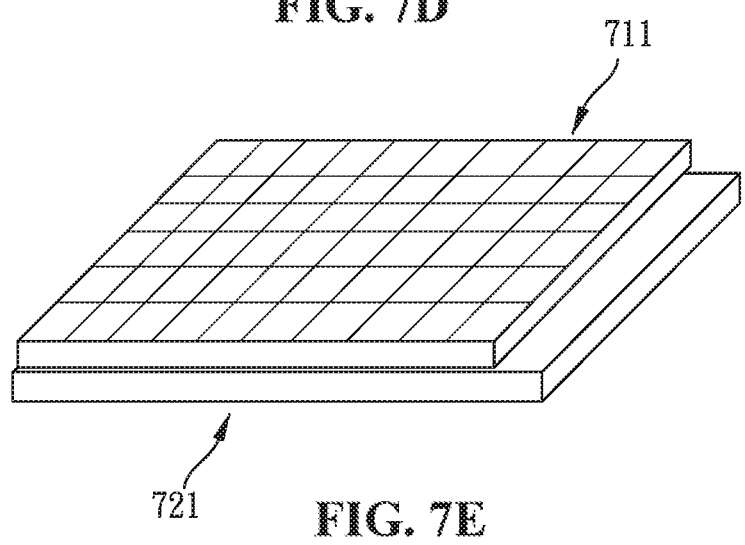
Figure 7F:
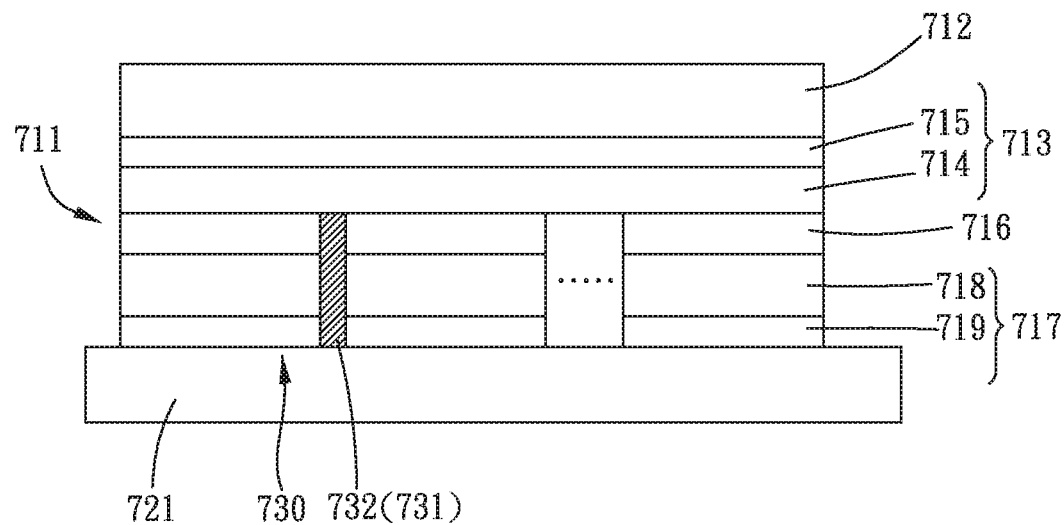

Referring next to FIG. 7E and FIG. 7F, the LED block 711 and the driver chip block 721 are bonded to each other so that the P-type semiconductor layer 717 is electrically connected to a plurality of pixel electrodes of the driver chip block 721. Preferably, to prevent influence on properties of the material, the LED block 711 and the driver chip block 721 are bonded by a low-temperature hybrid connection technology at a temperature lower than 200° C. Each of the micro LED pixels 730 corresponds to one of the pixel electrodes. In this way, each micro LED pixel 730 can be independently driven by a corresponding pixel electrode. It shall be appreciated that, the size of each micro LED pixels 730 is usually at the micrometer scale. In this embodiment of the present invention, the LED block 711 and the driver chip block 721 have already been diced from the LED wafer 710 and the driver circuit wafer 720 respectively before the bonding step is performed. It can be understood that, in another embodiment as shown in FIG. 7C, the whole LED wafer 710 may be bonded to the driver circuit wafer 720 and a dicing process is performed subsequently; or as shown in FIG. 7D, the LED block 711 may be diced from the LED wafer 710 in advance and then bonded to a corresponding position on the driver circuit wafer 720, and a dicing process is performed subsequently.

Figure 7G:
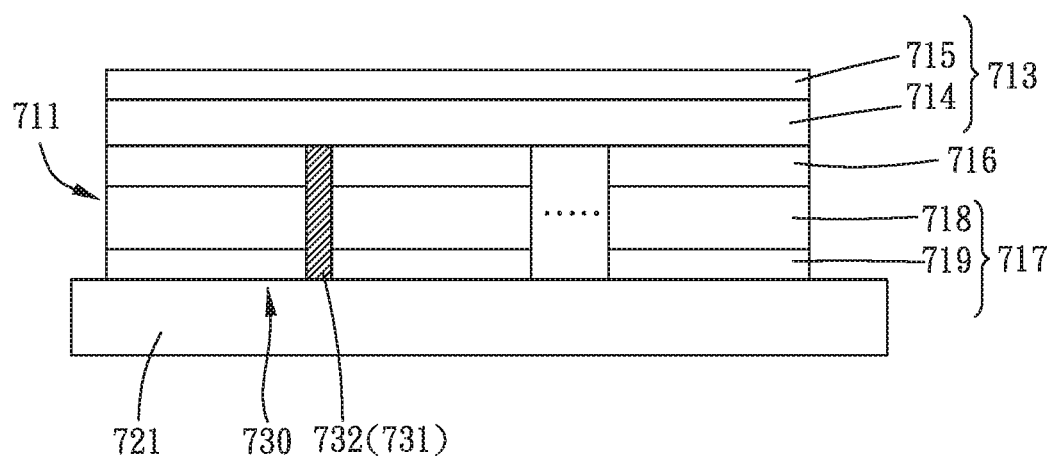

Referring next to FIG. 7G, the substrate is removed.

Figure 7H:
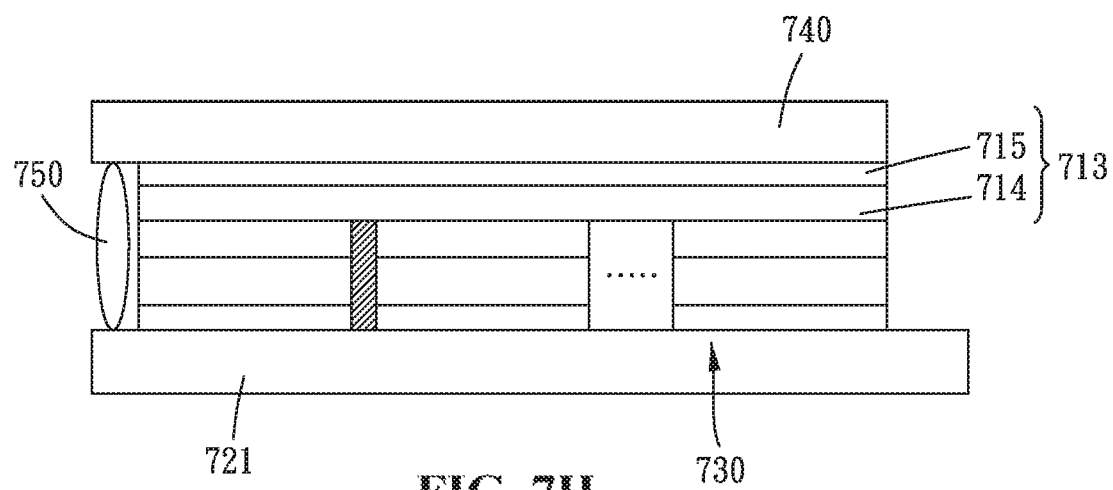

Referring next to FIG. 7H, a light transmissive conductive layer 740 is disposed on the N-type semiconductor layer 713, wherein the light transmissive conductive layer 740 has a common electrode corresponding to the micro LED pixels 730. Further speaking, the light transmissive conductive layer 740 comprises a glass layer coated with an ITO conductive film, and the ITO conductive film is electrically connected with each of the micro LED pixels 730. So that the ITO conductive film is the common electrode corresponding to the micro LED pixels 730. Moreover, the light transmissive conductive layer 740 is electrically connected to the driver chip block 721 via a conductive glue 750 so that, with a potential difference between the ITO conductive film and the pixel electrodes, each of the micro LED pixels 730 can be controlled to light up. In another embodiment as shown in FIG. 7K and FIG. 7L, the light transmissive conductive layer 741 may also be an ITO conductive layer formed through physical sputtering instead of having a glass layer.

Figure 7I:
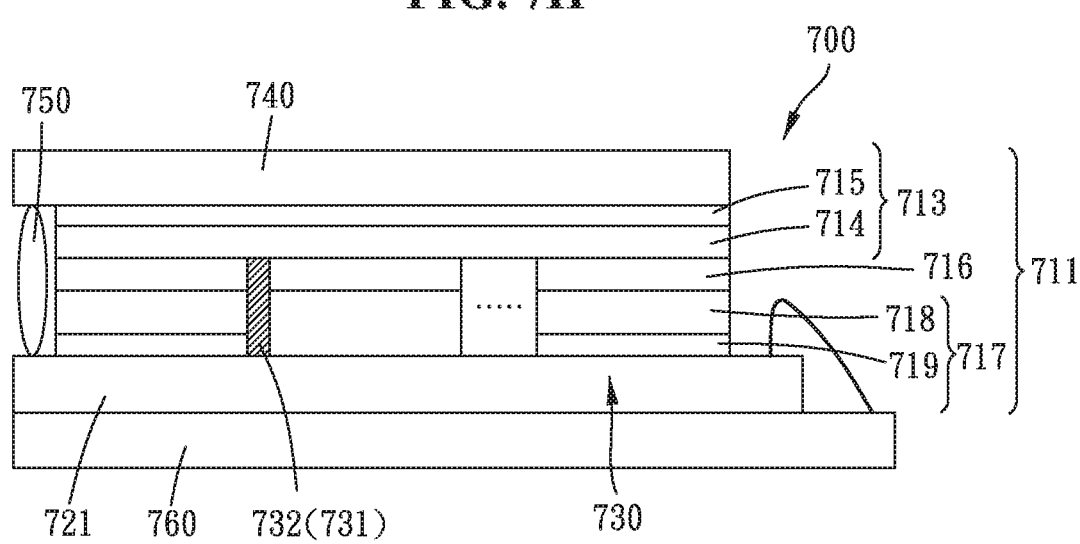
Figure 7J:
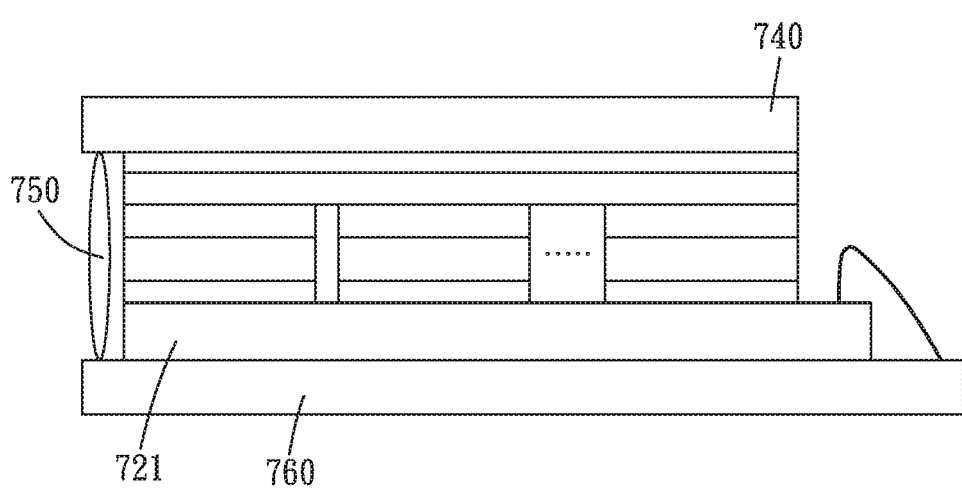
Figure 7K:
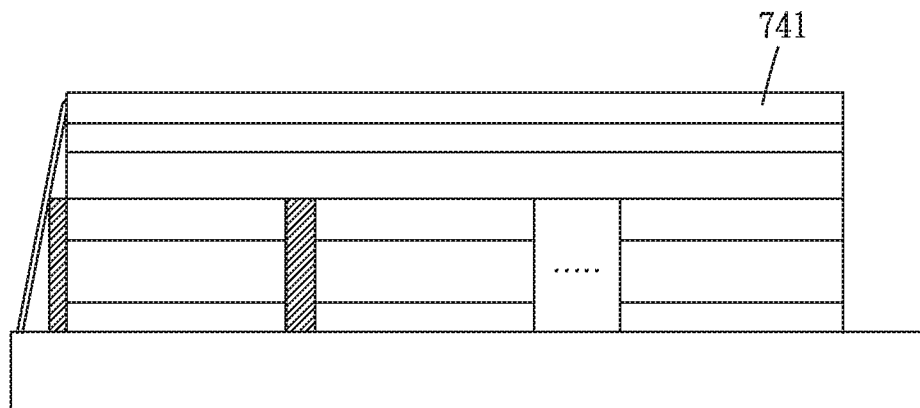
Figure 7L:
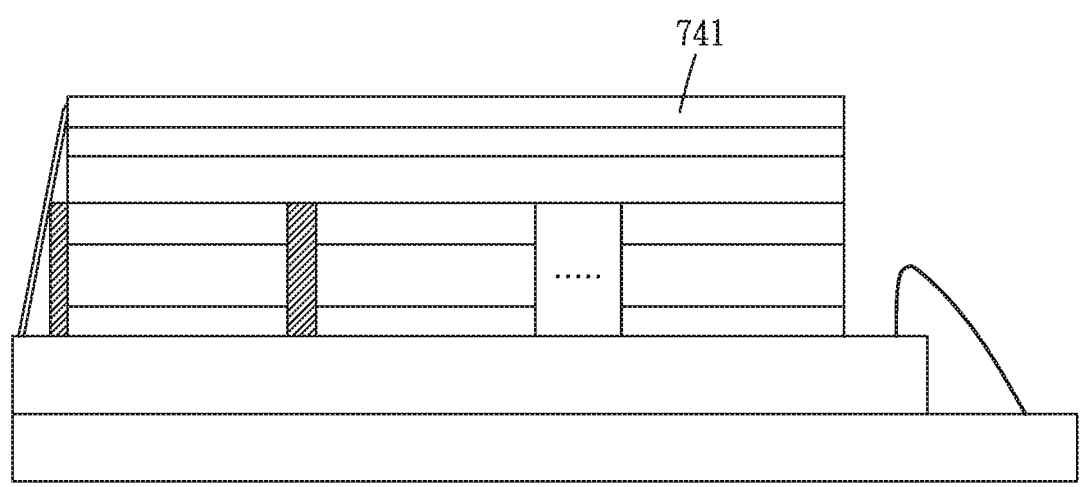

Referring next to FIG. 7I, the driver chip block 721 is electrically connected to a circuit board 760. It shall be appreciated that, when this step is performed, the driver chip block 721 and the LED block 711 have already been diced from the driver circuit wafer 720 and the LED wafer 710 respectively (i.e., have been in the form of an independent LED pixel array and an independent driver chip respectively). In another embodiment as shown in FIG. 7J, the conductive glue 750 may not connect the driver chip block 721, but connect the light transmissive conductive layer 740 and the circuit board 760. In some embodiments of the present invention, the conductive glue may not be provided, and instead, the ITO conductive film is electrically connected to other external power sources as long as there is a potential difference between the ITO conductive film and the pixel electrodes to allow each micro LED pixel to light up.

Through the aforesaid steps, a micro LED display module 700 as shown in FIG. 7I can be produced in this embodiment of the present invention. The micro LED display module 700 comprises the driver chip block 721, the LED block 711, the light transmissive conductive layer 740, and the circuit board 760. The driver chip block 721 has a plurality of pixel electrodes. The LED block 711 is disposed on the driver chip block 721. The LED block 711 has the first semiconductor layer, the light emitting layer 716, the second semiconductor layer and a plurality of trenches 731. The light emitting layer 716 is located between the first semiconductor layer and the second semiconductor layer. The second semiconductor layer is electrically connected to the pixel electrodes. The trenches 731 define the plurality of micro LED pixels 730 arranged in an array form. Each of the trenches 731 penetrates through the second semiconductor layer and the light emitting layer 716. Each of the micro LED pixels 730 corresponds to one of the pixel electrodes. One of the first semiconductor layer and the second semiconductor layer is the N-type semiconductor layer 713 and the other is the p-type semiconductor layer 717. Each of the trenches 731 is filled with the non-conductive glue 732 therein.

The light transmissive conductive layer 740 is disposed on the LED block 711 and connected to the first semiconductor layer. The LED block 711 is located between the light transmissive conductive layer 740 and the driver chip block 721. The circuit board 760 is electrically connected to the driver chip block 721, and the driver chip block 721 is located between the LED block 711 and the circuit board 760. The conductive glue 750 is disposed between the light transmissive conductive layer 740 and the driver chip block 721 to electrically connect the light transmissive conductive layer 740 and the driver chip block 721 respectively. The light transmissive conductive layer 740 comprises a glass layer coated with an ITO conductive film, and the ITO conductive film is electrically connected to each of the micro LED pixels 730 (of course, the light transmissive conductive layer 741 may also have only the ITO conductive layer but not have the glass layer as shown in FIG. 7L). In another embodiment as shown in FIG. 7J, the conductive glue 750 may also be disposed between the light transmissive conductive layer 740 and the driver chip block 721 to electrically connect the light transmissive conductive layer 740 and the driver chip block 721 respectively.

Please refer to FIG. 8A, FIG. 8B, FIG. 8C, FIG. 8D, FIG. 8E and FIG. 8F, which show a third embodiment of the present invention. A manufacturing method of a micro LED display module 800 according to this embodiment comprises the following steps.

Initially, a LED wafer 810 and a driver circuit wafer are prepared. A portion of the LED wafer 810 is defined as a LED block 811, and a chip size portion of the driver circuit wafer 820 is defined as a driver chip block 821. The LED block 811 has a first semiconductor layer, a light emitting layer 816 and a second semiconductor layer. The light emitting layer 816 is disposed between the first semiconductor layer and the second semiconductor layer. The first semiconductor layer connects with a substrate 812. One of the first semiconductor layer and the second semiconductor layer is a N-type semiconductor layer and the other is a P-type semiconductor layer. More specifically, the first semiconductor layer is a N-type semiconductor layer 813 and the second semiconductor layer is a P-type semiconductor layer 817. The N-type semiconductor layer 813 comprises a N-type doped layer 814 and a N-type buffer layer 815, and the N-type doped layer 814 is located between the N-type buffer layer 815 and the light emitting layer 816. The P-type semiconductor layer 817 further comprises a P-type doped layer 818 and a P-type buffer layer 819, and the P-type doped layer 818 is located between the P-type buffer layer 819 and the light emitting layer 816. In some embodiments of the present invention, there may not be the N-type or P-type buffer layer.

Figure 8A:
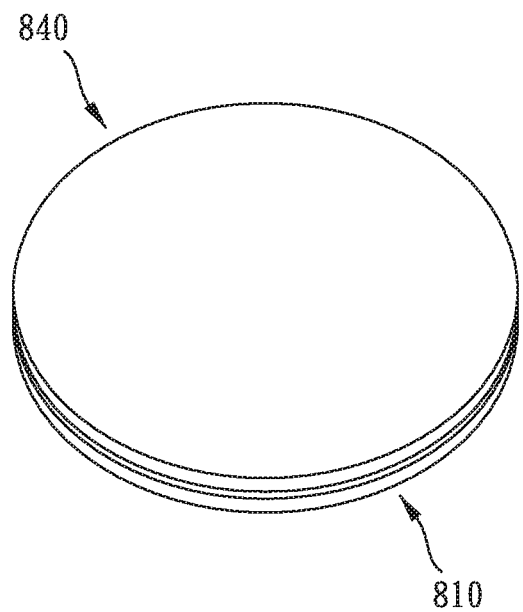
FIGS. 8A to 8G are schematic views of a third embodiment and other alternative embodiments according to the present invention.
Figure 8B:
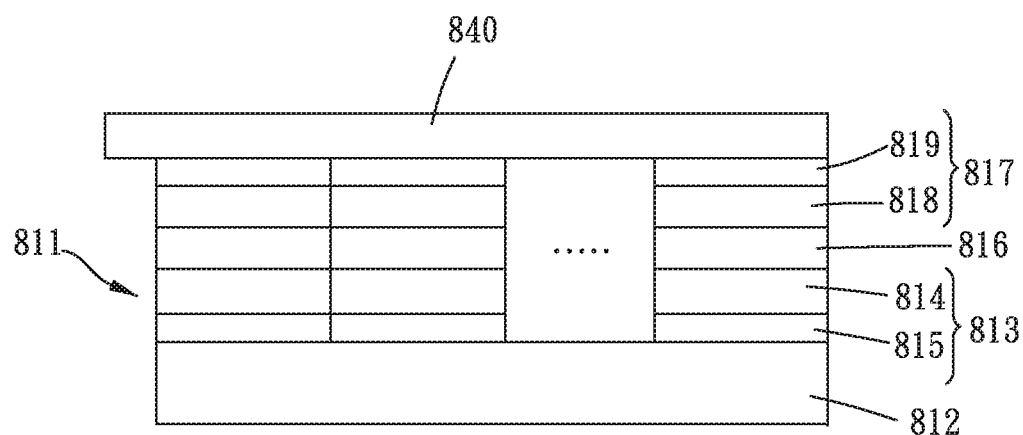

A light transmissive conductive layer 840 is disposed on the P-type semiconductor layer 817 of the LED block 811. Further speaking, the light transmissive conductive layer 840 comprises a glass layer coated with an ITO conductive film, and the ITO conductive film is electrically connected with the P-type semiconductor layer 817. In this embodiment of the present invention, as shown in FIG. 8A, this step is actually to bond the LED wafer 810 and the light transmissive conductive layer 840 to each other, and the light transmissive conductive layer 840 is an ITO glass wafer. After the step is finished, the LED block 811 is diced from the LED wafer 810, as shown in FIG. 8B. In other embodiments of the present invention, the LED block 811 may be diced from the LED wafer 810 in another subsequent step.

Figure 8C:
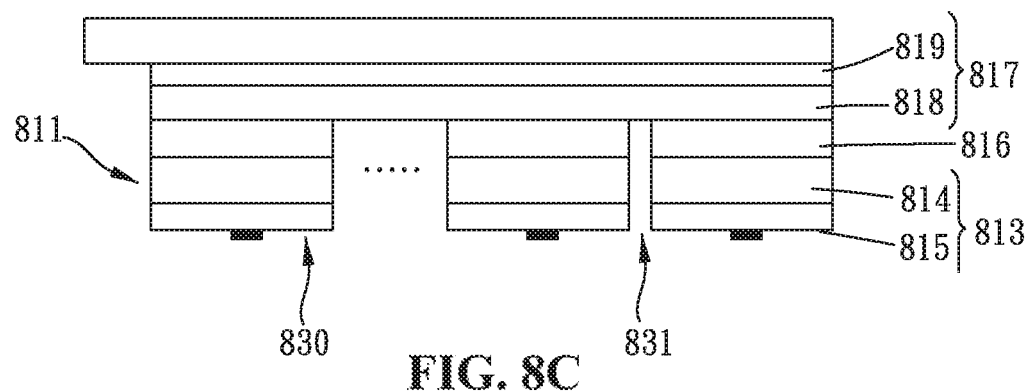

Next, as described in FIG. 8C, the substrate 812 is removed, and the LED block 811 is etched to form a plurality of trenches 831 arranged crisscrossingly. The trenches 831 define a plurality of micro LED pixels 830 arranged in an array, and each of the trenches 831 at least penetrates through the N-type semiconductor layer 813 and the light emitting layer 816. In this embodiment of the present invention, each of the trenches 831 does not penetrate through the P-type semiconductor layer 817, and the ITO conductive film and the P-type semiconductor layer 817 act as a common electrode corresponding to the micro LED pixels 830. In other embodiments of the present invention, each of the trenches may penetrate through the P-type semiconductor layer or penetrate through only the P-type doped layer, so that all of the micro LED pixels can move in an array instead of moving individually. It can be understood that, the whole LED wafer may be etched in the step of etching the LED block.

Figure 8D:
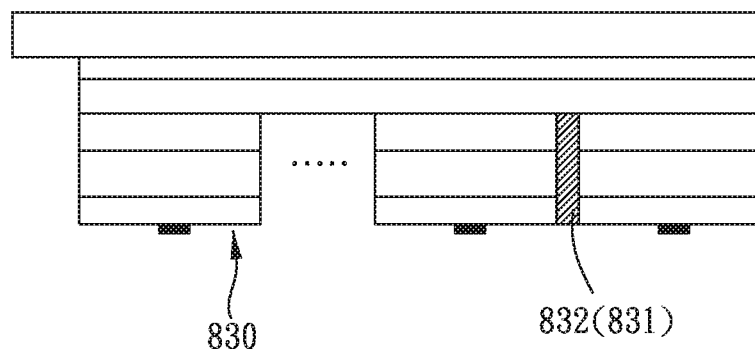

Referring next to FIG. 8D, non-conductive glue 832 is filled into the trenches 831 to improve the structural strength between the micro LED pixels 830. In other embodiments of the present invention, this step may be omitted.

Figure 8E:
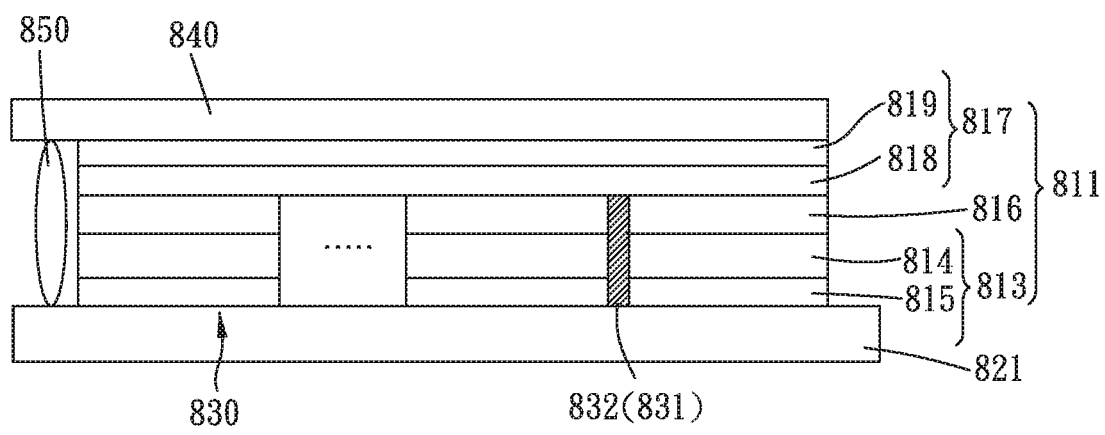

Referring next to FIG. 8E, the LED block 811 and the driver chip block 821 are bonded to each other so that the N-type semiconductor layer 813 is electrically connected to a plurality of pixel electrodes of the driver chip block 821. Preferably, to prevent influence on properties of the material, the LED block 811 and the driver chip block 821 are bonded by a low-temperature hybrid connection technology at a temperature lower than 200° C. Each of the micro LED pixels 830 corresponds to one of the pixel electrodes. In this way, each of the micro LED pixels 830 can be independently driven by the corresponding pixel electrode. It shall be appreciated that, the size of each of the micro LED pixels 830 is usually at the micrometer scale. In this embodiment of the present invention, the LED block 811 and the driver chip block 821 have already been diced from the LED wafer and the driver circuit wafer respectively before the bonding step is performed. It can be understood that, in other embodiments of the present invention, it may be that the whole LED wafer is bonded to the driver circuit wafer; or the LED block is diced from the LED wafer in advance and then bonded to a corresponding position on the driver circuit wafer, then the driver circuit wafer is diced in another subsequent step.

Figure 8F:
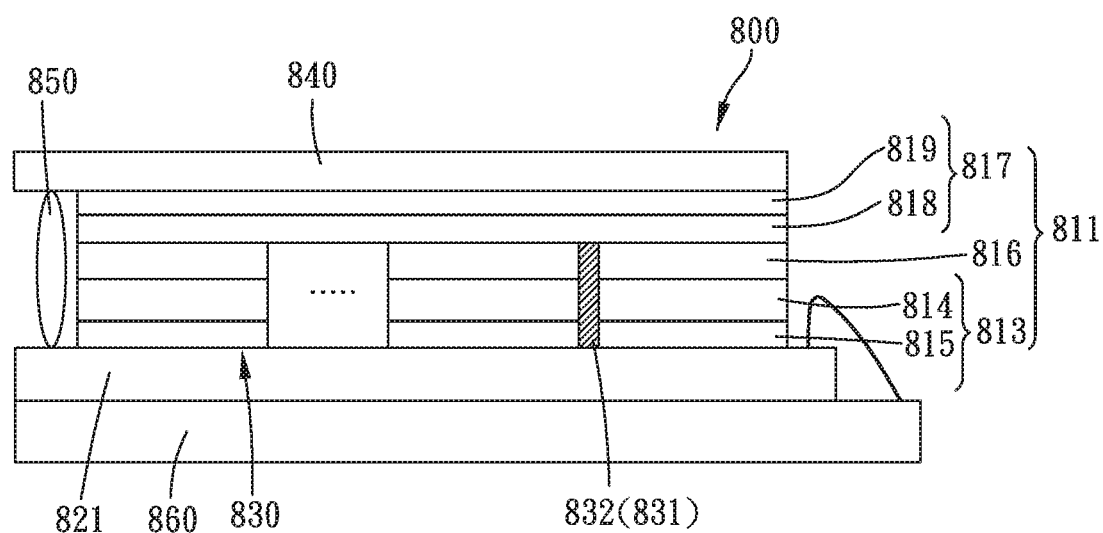
Figure 8G:
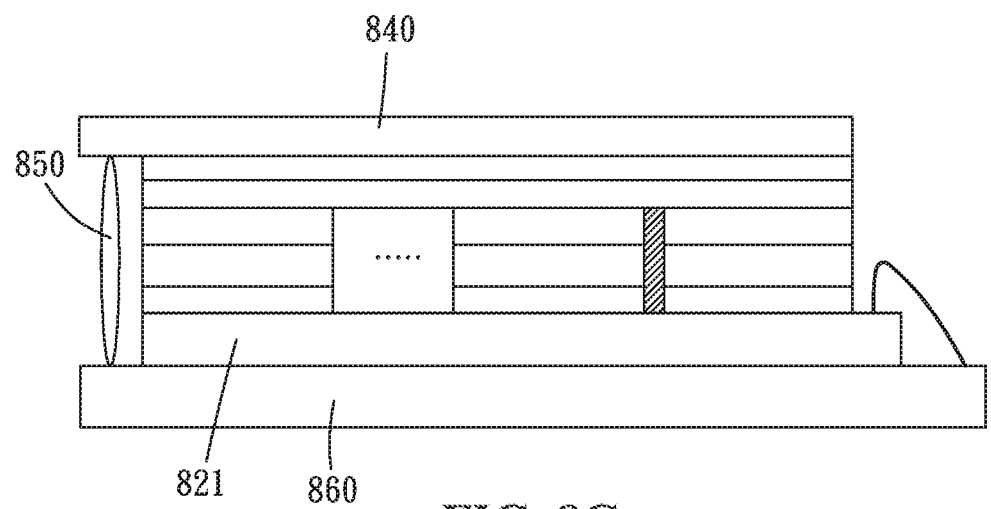

Referring next to FIG. 8F, the driver chip block 821 is electrically connected to a circuit board 860. It shall be appreciated that, when this step is performed, the driver chip block 821 and the LED block 811 have already been diced from the driver circuit wafer and the LED wafer respectively (i.e., have been in the form of an independent LED pixel array and an independent driver chip respectively). In this embodiment of the present invention, the light transmissive conductive layer 840 is electrically connected to the driver chip block 821 via a conductive glue 850 so that, with a potential difference between the ITO conductive film and the pixel electrodes, each of the micro LED pixels 830 can be controlled to light up. In other embodiments as shown in FIG. 8G, the conductive glue 850 may electrically connect the light transmissive conductive layer 840 and the circuit board 860 but not connect the driver chip block 821. In some embodiments of the present invention, the conductive glue may not be disposed and, instead, the ITO conductive film is electrically connected to other external power sources as long as there is a potential difference between the ITO conductive film and the pixel electrodes to allow each micro LED pixel to light up.

Through the aforesaid steps, a micro LED display module 800 as shown in FIG. 8F can be produced in this embodiment of the present invention. The micro LED display module comprises the driver chip block 821, the LED block 811, the light transmissive conductive layer 840, and the circuit board 860. The driver chip block 821 has the plurality of pixel electrodes. The LED block 811 is disposed on the driver chip block 821. The LED block 811 has the first semiconductor layer, the light emitting layer 816, the second semiconductor layer and the plurality of trenches 831. The light emitting layer 816 is located between the first semiconductor layer and the second semiconductor layer. The second semiconductor layer is electrically connected to the pixel electrodes. The trenches 831 define the plurality of micro LED pixels 830 arranged in an array form. Each of the trenches 831 penetrates through the second semiconductor layer and the light emitting layer 816. Each of the micro LED pixels 830 corresponds to one of the pixel electrodes. One of the first semiconductor layer and the second semiconductor layer is the N-type semiconductor layer 813 and the other is the P-type semiconductor layer 817. Each of the trenches 831 is filled with the non-conductive glue 832 therein.

The light transmissive conductive layer 840 is disposed on the LED block 811 and connected to the first semiconductor layer. The LED block 811 is located between the light transmissive conductive layer 840 and the driver chip block 821. The circuit board 860 is electrically connected to the driver chip block 821, and the driver chip block 821 is located between the LED block 811 and the circuit board 860. A conductive glue 850 is disposed between the light transmissive conductive layer 840 and the driver chip block 821 to electrically connect the light transmissive conductive layer 840 and the driver chip block 821 respectively. The light transmissive conductive layer 840 comprises a glass layer coated with the ITO conductive film, and the ITO conductive film is electrically connected to each of the micro LED pixels 830. In another embodiment as shown in FIG. 8G, the conductive glue 850 may also be disposed between the light transmissive conductive layer 840 and the driver chip block 821 to electrically connect the light transmissive conductive layer 840 and the driver chip block 821 respectively.

Please refer to FIG. 9A, FIG. 9B, FIG. 9E, FIG. 9F and FIG. 9G, which show a fourth embodiment of the present invention. A manufacturing method of a micro LED display module having a light transmissive substrate according to this embodiment comprises the following steps.

Figure 9A:
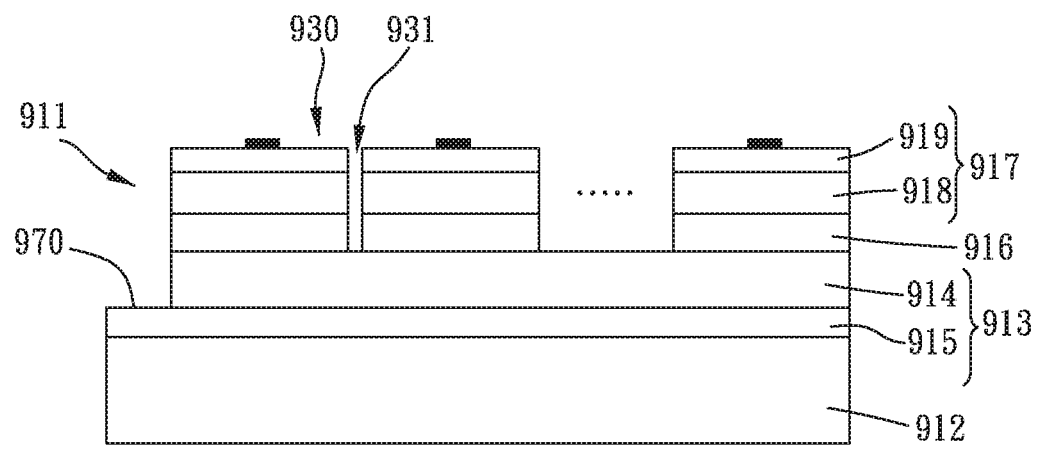
FIGS. 9A to 9H are schematic views of a fourth embodiment and other alternative embodiments according to the present invention.

Initially, a LED wafer 910 and a driver circuit wafer 920 are prepared. A portion of the LED wafer 910 is defined as a LED block 911, and a chip size portion of the driver circuit wafer 920 is defined as a driver chip block 921. The LED block 911 has a first semiconductor layer, a light emitting layer 916 and a second semiconductor layer. The light emitting layer 916 is disposed between the first semiconductor layer and the second semiconductor layer. The first semiconductor layer connects with a light transmissive substrate 912. One of the first semiconductor layer and the second semiconductor layer is a N-type semiconductor layer and the other is a P-type semiconductor layer. More specifically, the first semiconductor layer is a N-type semiconductor layer 913 and the second semiconductor layer is a P-type semiconductor layer 917. The N-type semiconductor layer 913 comprises a N-type doped layer 914 and a N-type buffer layer 915, and the N-type doped layer 914 is located between the N-type buffer layer 915 and the light emitting layer 916. The P-type semiconductor layer 917 further comprises a P-type doped layer 918 and a P-type buffer layer 919, and the P-type doped layer 918 is located between the P-type buffer layer 919 and the light emitting layer 916. In some embodiments of the present invention, there may not be the N-type or P-type buffer layer. The light transmissive substrate has good light transmissivity with respect to the visible band, e.g., may be a sapphire substrate. Referring to FIG. 9A, the LED block 911 is etched to form a plurality of trenches 931 arranged crisscrossingly. The trenches 931 define a plurality of micro LED pixels 930 arranged in an array, and each of the trenches 931 penetrates through the P-type semiconductor layer 917 and the light emitting layer 916. Further speaking, each of the trenches 931 does not penetrate through the N-type semiconductor layer 913, and the N-type semiconductor layer 913 has a common electrode corresponding to the micro LED pixels 930. In other embodiments of the present invention, each of the trenches may also penetrate through the N-type semiconductor layer as long as at least a part of the N-type semiconductor layer can act as a common electrode. It can be understood that, the step of etching the LED block may etch the whole LED wafer, or etch only the LED block 911 that has been diced. The N-type semiconductor layer 913 has a common electrode corresponding to the micro LED pixels 930, and the common electrode has a protrusion 970 that protrudes in the horizontal direction. In this embodiment of the present invention, the N-type buffer layer 915 has the protrusion 970, which is generated during the step of etching the LED block, and the N-type buffer layer 915 acts as the common electrode of the micro LED pixels.

Figure 9B:
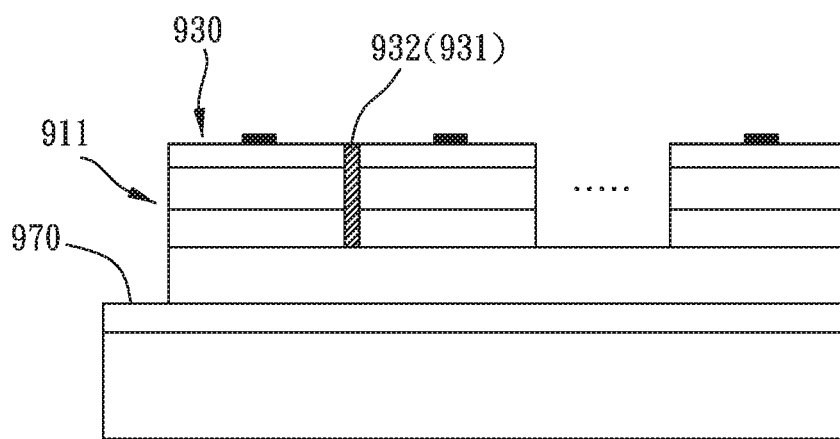

Referring next to FIG. 9B, a non-conductive glue 932 is filled into the trenches 931 to improve the structural strength between the micro LED pixels 930. In other embodiments of the present invention, this step may be omitted.

Figure 9C:
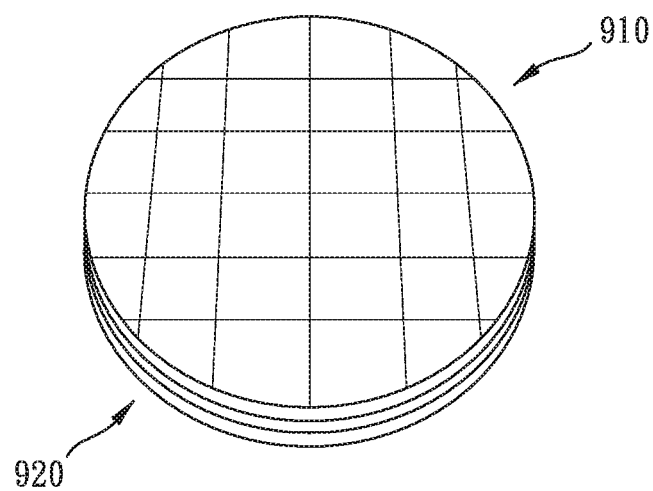
Figure 9D:
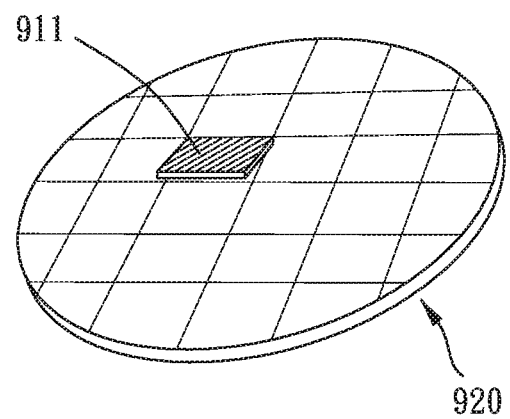
Figure 9E:
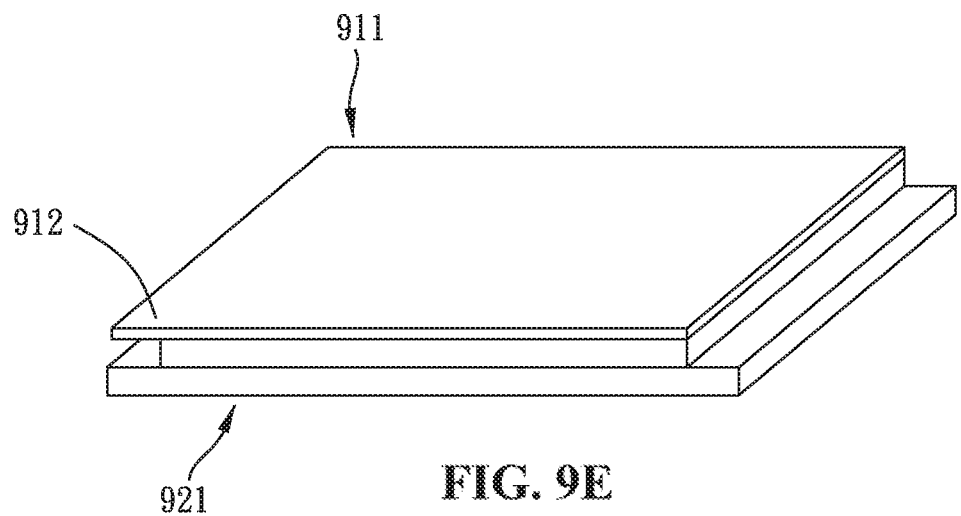
Figure 9F:
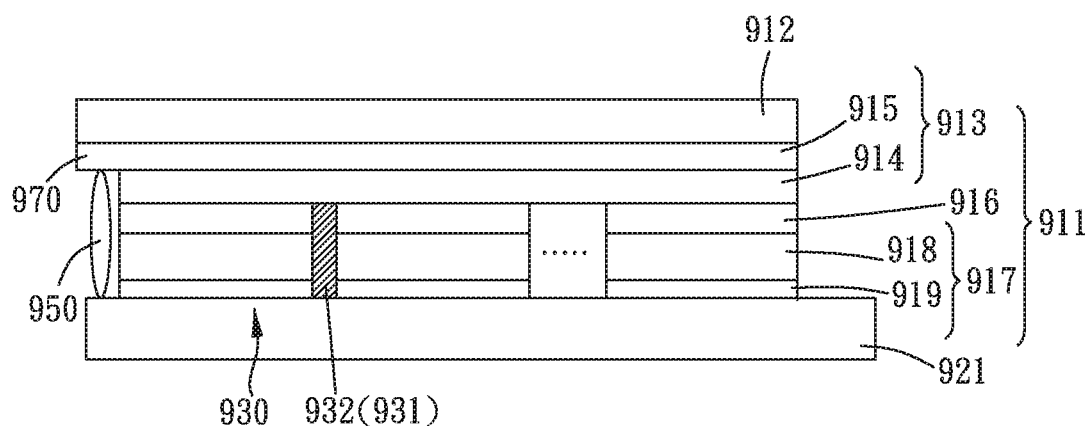

Referring next to FIG. 9E and FIG. 9F, the LED block 911 and the driver chip block 921 are bonded to each other so that the P-type semiconductor layer 917 is electrically connected to a plurality of pixel electrodes of the driver chip block 921. Preferably, to prevent influence on properties of the material, the LED block 911 and the driver chip block 921 are bonded by a low-temperature hybrid connection technology at a temperature lower than 200° C. Each of the micro LED pixels 930 corresponds to one of the pixel electrodes. In this way, each micro LED pixel 930 can be independently powered by the corresponding pixel electrode. It shall be appreciated that, the size of each micro LED pixels 930 is usually at the micrometer scale. In this embodiment of the present invention, the LED block 911 and the driver chip block 921 have already been diced from the LED wafer and the driver circuit wafer respectively before the bonding step is performed. It can be understood that, in another embodiment as shown in FIG. 9C, the whole LED wafer 910 is bonded to the driver circuit wafer 920; or as shown in FIG. 9D, the LED block 911 is diced from the LED wafer 910 first and then bonded to a corresponding position on the driver circuit wafer 920, and a dicing process is performed subsequently.

Besides, the protrusion 970 is electrically connected to the driver chip block 921 via a conductive glue 950 so that, with a potential difference between the N-type buffer layer 915 and the pixel electrodes, each of the micro LED pixels 930 can be controlled to light up.

It shall be appreciated that, this embodiment does not need to remove the light transmissive substrate 912.

Figure 9G:
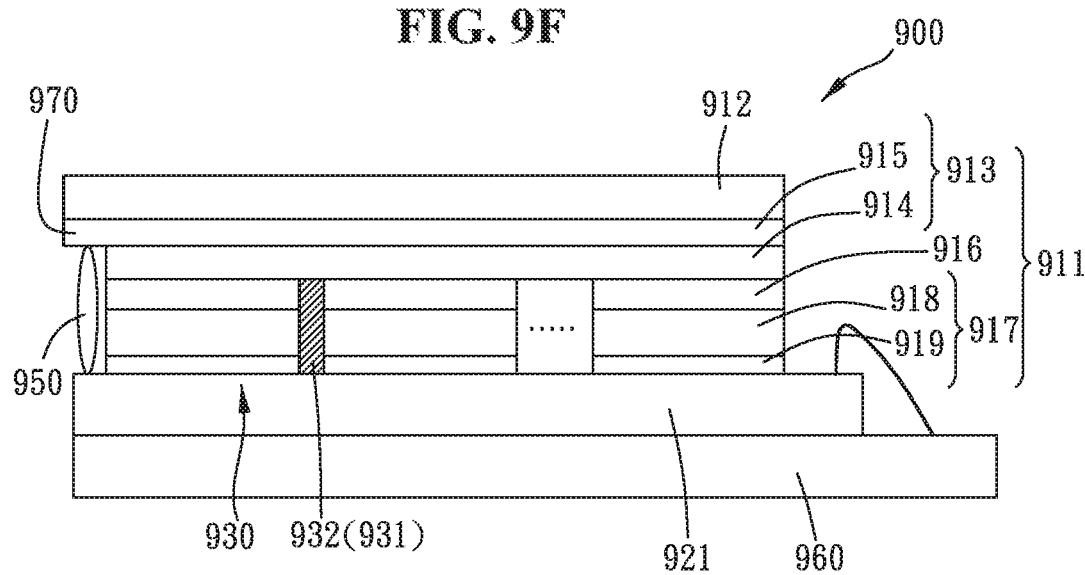
Figure 9H:
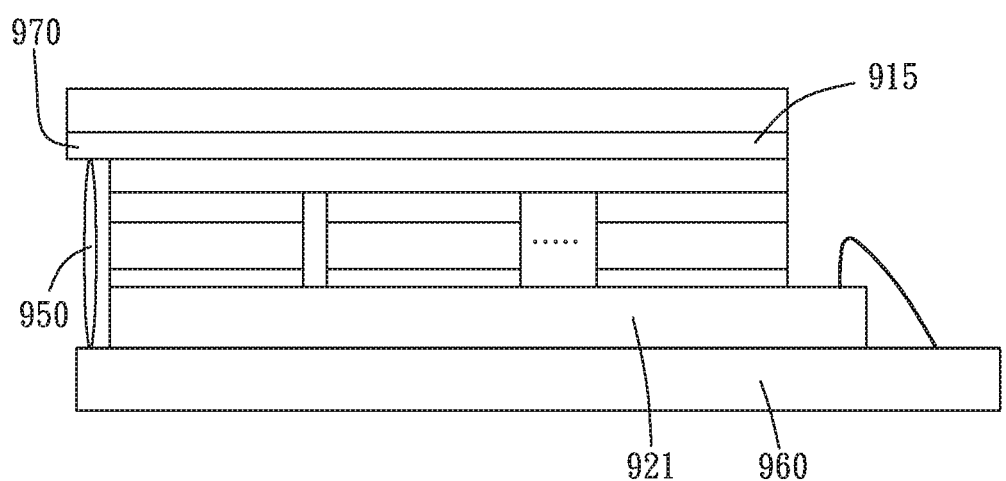

Referring next to FIG. 9G, the driver chip block 921 is electrically connected to a circuit board 960. It shall be appreciated that, when this step is performed, the driver chip block 921 and the LED block 911 have already been diced from the driver circuit wafer 920 and the LED wafer 910 respectively (i.e., have been in the form of an independent LED pixel array and an independent driver chip respectively). In another embodiment as shown in FIG. 9H, the conductive glue 950 may not connect the driver chip block 921, but connect the protrusion 970 and the circuit board 960. In some embodiments of the present invention, the conductive glue 950 may not be provided, and instead, the ITO conductive film is electrically connected to other external power sources as long as there is a potential difference between the ITO conductive film and the pixel electrodes to allow each micro LED pixel 930 to light up.

Through the aforesaid steps, a micro LED display module having a light transmissive substrate as shown in FIG. 9G can be produced in this embodiment of the present invention. The micro LED display module comprises the driver chip block 921, the LED block 911, and the circuit board 960. The driver chip block 921 has a plurality of pixel electrodes. The LED block 911 is disposed on the driver chip block 921. The LED block 911 has the first semiconductor layer, the light emitting layer 916, the second semiconductor layer and the plurality of trenches 931. The light emitting layer 916 is located between the first semiconductor layer and the second semiconductor layer. The second semiconductor layer is electrically connected to the pixel electrodes. The trenches 931 define the plurality of micro LED pixels 930 arranged in an array form. Each of the trenches 931 penetrates through the second semiconductor layer and the light emitting layer 916. Each of the micro LED pixels 930 corresponds to one of the pixel electrodes. Each of the trenches 931 is filled with the non-conductive glue 932 therein. The first semiconductor layer has the protrusion 970 that protrudes in the horizontal direction. The first semiconductor layer is connected to the light transmissive substrate 912 and located between the light transmissive substrate 912 and the light emitting layer 916.

The circuit board 960 is electrically connected to the driver chip block 921, and the driver chip block 921 is located between the LED block 911 and the circuit board 960. A conductive glue 950 is disposed between the protrusion 970 and the driver chip block 921 to electrically connect the protrusion 970 and the driver chip block 921 respectively. In another embodiment as shown in FIG. 9H, the conductive glue 950 may also be disposed between the protrusion 970 and the circuit board 960 to electrically connect the protrusion 970 and the circuit board 960 respectively.

Figure 10A:
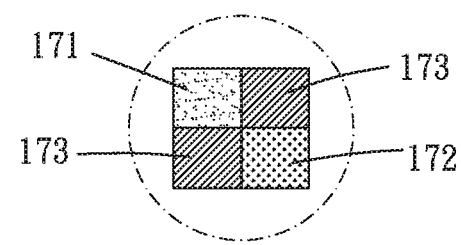
FIG. 10A is a partially enlarged view of a color filter according to the present invention.
Figure 10:
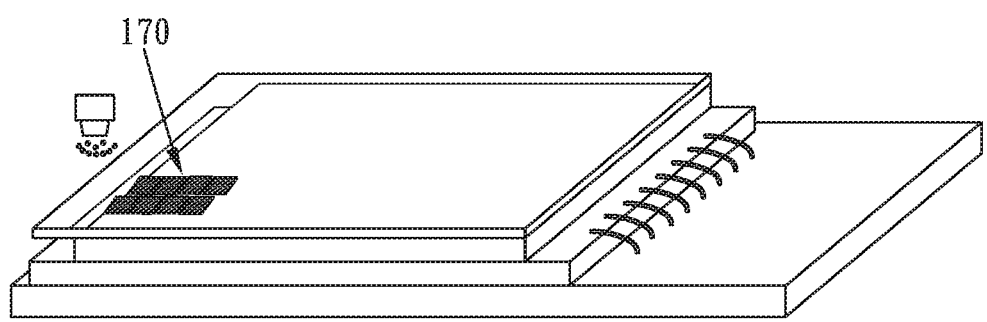
FIGS. 10 to 11 are schematic views illustrating a step of disposing a color layer according to the present invention.
Figure 11:
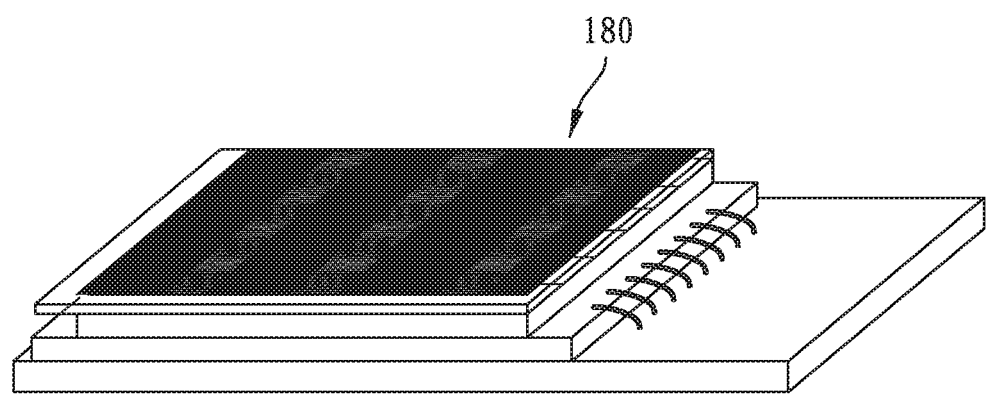

Referring to FIG. 10, to have each of the micro LED display modules of all the aforesaid embodiments emit light of different colors, a color layer 170 (a RGB color layer) may be additionally disposed to emit light of three colors from the micro LED display module. Further speaking, the color layer 170 is formed by spraying a corresponding RGB quantum dot on each of the micro LED pixels so that the quantum dots are excited by the micro LED pixels to emit light of the three colors. Further speaking, the color layer 170 has a plurality of red, blue and green pixel regions 171, 172, 173, each of which corresponds to one of the micro LED pixels, and the color layer 170 has a plurality of full-color display dots (units capable of displaying light of the three colors). Each of the full-color dots has at least three-pixel regions 171, 172, 173 adjacent to each other, at least including one red pixel region 171, one blue pixel region 172 and one green pixel region 173. Preferably, to satisfy requirements of the manufacturing process, one full-color display dot may include four-pixel regions adjacent to each other (e.g., one red pixel region 171, one blue pixel region 172 and two green pixel regions 173 as shown in FIG. 10A) so that the full-color display dots are arranged regularly. In other embodiments as shown in FIG. 11, the color layer 180 may also be a RGB color filter.

In the various embodiments of the present invention, novel structures and methods have been described for to a micro LED display module and a manufacturing method thereof. The various embodiments of the structures and methods of this invention that are described above are illustrative only of the principles of this invention and are not intended to limit the scope of the invention to the particular embodiment described. Thus, the invention is limited only by the following claims.

What is claimed is:

1. A manufacturing method of micro light emitting diode (LED) display module, the method comprising the following steps:
   initially, preparing a LED wafer and a driver circuit wafer, wherein a portion of the LED wafer is defined as a LED block, the LED block has a first semiconductor layer, a light emitting layer and a second semiconductor layer, the light emitting layer is disposed between the first semiconductor layer and the second semiconductor layer, the first semiconductor layer connects with a substrate, the first semiconductor layer is a N-type semiconductor layer and the second semiconductor layer is a P-type semiconductor layer, and a chip size portion of the driver circuit wafer is defined as a driver chip block;
   next, etching the LED block to form a plurality of trenches arranged crisscrossingly, wherein the trenches define a plurality of micro LED pixels arranged in an array, each of the trenches at least penetrates through the second semiconductor layer and the light emitting layer, and the first semiconductor layer is not penetrated through by each of the trenches;
   next, bonding the LED block and the driver chip block to each other, wherein the second semiconductor layer is electrically connected to a plurality of pixel electrodes of the driver chip block, and each of the micro LED pixels corresponds to one of the pixel electrodes; and
   next, removing the substrate;
   next, disposing a light transmissive conductive layer on the first semiconductor layer, wherein the light transmissive conductive layer has a common electrode corresponding to the micro LED pixels; and
   next, disposing a color layer on the light transmissive conductive layer, wherein the color layer is a red, green and blue color layer.

2. The manufacturing method according to claim 1, wherein the N-type semiconductor layer further comprises a N-type doped layer and a N-type buffer layer, and the N-type doped layer is located between the N-type buffer layer and the light emitting layer.

3. The manufacturing method according to claim 1, wherein the P-type semiconductor layer further comprises a P-type doped layer and a P-type buffer layer, and the P-type doped layer is located between the P-type buffer layer and the light emitting layer.

4. The manufacturing method according to claim 1, further comprising a step of electrically connecting the driver chip block with a circuit board, wherein the driver chip block is a driver chip diced from the driver circuit wafer.

5. The manufacturing method according to claim 4, wherein the light transmissive conductive layer is electrically connected with the circuit board via a conductive glue after the step of disposing the light transmissive layer.

6. The manufacturing method according to claim 1, wherein the light transmissive conductive layer is electrically connected with the driver chip block via a conductive glue.

7. The manufacturing method according to claim 1, wherein the light transmissive conductive layer comprises a glass layer coated with an ITO conductive film, and the ITO conductive film is electrically connected with each of the micro LED pixels.

8. The manufacturing method according to claim 1, wherein the light transmissive conductive layer is an ITO conductive layer formed through physical sputtering.

9. The manufacturing method according to claim 1, wherein the color layer is a color filter.

10. The manufacturing method according to claim 1, wherein the color layer is formed by spraying quantum dots.

11. The manufacturing method according to claim 1, further comprising the following step before the step of bonding the LED block and the driver chip block to each other and after the step of etching the LED block: dicing the LED block from the LED wafer; and wherein the step of bonding the LED block and the driver chip block to each other is to bond the LED block and the driver circuit wafer having the driver chip block to each other.

12. The manufacturing method according to claim 1, further comprising the following step before the step of bonding the LED block and the driver chip block to each other and after the step of preparing the LED wafer and the driver circuit wafer: dicing the LED block and the driver chip block from the LED wafer and the driver circuit wafer respectively.

13. The manufacturing method according to claim 1, wherein the step of bonding the LED block and the driver chip block to each other is to bond the LED wafer having the LED block and the driver circuit wafer having the driver chip block to each other.

14. The manufacturing method according to claim 1, further comprising the following step: filling non-conductive glue into the trenches.

* * * * *